(12) United States Patent
Nakamoto et al.

(10) Patent No.: US 7,964,856 B2
(45) Date of Patent: Jun. 21, 2011

(54) ION IMPLANTING APPARATUS

(75) Inventors: Ichiro Nakamoto, Tokyo (JP); Hiroshi Horai, Tokyo (JP); Tatsuya Sodekoda, Tokyo (JP); Masahiro Yoshida, Tokyo (JP)

(73) Assignee: IHI Corporation, Tokyo (JP)

( * ) Notice: Subject to any disclaimer, the term of this patent is extended or adjusted under 35 U.S.C. 154(b) by 277 days.

(21) Appl. No.: 12/294,674

(22) PCT Filed: Mar. 27, 2007

(86) PCT No.: PCT/JP2007/056474
§ 371 (c)(1),
(2), (4) Date: Sep. 26, 2008

(87) PCT Pub. No.: WO2007/114120
PCT Pub. Date: Oct. 11, 2007

(65) Prior Publication Data
US 2010/0171048 A1   Jul. 8, 2010

(30) Foreign Application Priority Data
Mar. 31, 2006   (JP) .................. 2006-099477

(51) Int. Cl.
*G21K 5/10* (2006.01)
(52) U.S. Cl. ............. 250/492.23; 250/492.1; 250/492.3; 250/492.2; 250/492.21
(58) Field of Classification Search .......... None
See application file for complete search history.

(56) References Cited

U.S. PATENT DOCUMENTS

| | | | | |
|---|---|---|---|---|
| 6,013,332 A * | 1/2000 | Goto et al. | ............ | 427/530 |
| 7,345,754 B1 * | 3/2008 | Zhao et al. | ............ | 356/237.5 |
| 2002/0196419 A1 * | 12/2002 | Mizouchi | ............ | 355/67 |
| 2005/0110972 A1 * | 5/2005 | Tsuji et al. | ............ | 355/67 |
| 2005/0253089 A1 | 11/2005 | Maeno et al. | | |
| 2006/0097193 A1 * | 5/2006 | Horsky et al. | ............ | 250/492.21 |
| 2006/0258128 A1 * | 11/2006 | Nunan et al. | ............ | 438/510 |

(Continued)

FOREIGN PATENT DOCUMENTS
CN   1700402 A   11/2005
(Continued)

OTHER PUBLICATIONS

Chinese Office Action issued in corresponding Chinese Patent Application No. 200780012023, dated Nov. 13, 2009.

(Continued)

*Primary Examiner* — Bernard E Souw
*Assistant Examiner* — Andrew Smyth
(74) *Attorney, Agent, or Firm* — Griffin & Szipl, P.C.

(57) ABSTRACT

In an ion implanting apparatus 10 including a separation slit 20 which receives an ion beam 1 having passed through a mass-separation electromagnet 17 and allows a desired type of ion to selectively pass therethrough, the separation slit 20 is operable to vary a shape of a gap through which the ion beam 1 passes. In addition, the ion implanting apparatus 10 includes a variable slit 30 which is disposed between an extraction electrode system 15 and the mass-separation electromagnet 17 so as to form a gap through which the ion beam 1 passes and is operable to vary a shape of the gap so as to shield a part of the ion beam 1 extracted from the ion source 12. The ion implanting apparatus 10 may include both or one of the separation slit 20 and the variable slit 30.

8 Claims, 4 Drawing Sheets

U.S. PATENT DOCUMENTS

2007/0045557 A1 * 3/2007 Angel et al. .............. 250/396 R

FOREIGN PATENT DOCUMENTS

| JP | 54-051589 | | | 4/1979 |
|---|---|---|---|---|
| JP | 54-51589 | A | | 4/1979 |
| JP | 03-230462 | | | 10/1991 |
| JP | 05-144407 | | | 6/1993 |
| JP | 8-315766 | | | 11/1996 |
| JP | 08-315766 | | | 11/1996 |
| JP | 08315766 | A | * | 11/1996 |
| JP | 9-245718 | | | 9/1997 |
| JP | 09245718 | A | * | 9/1997 |
| JP | 10-302707 | | | 11/1998 |
| JP | 11-339711 | | | 12/1999 |
| JP | 2005-327713 | | | 11/2005 |

OTHER PUBLICATIONS

Chinese Office Action issued in corresponding Chinese Patent Application No. 200780012023.2, dated May 17, 2010.

Office Action issued in corresponding Korean Patent Application No. 10-2008-7023935, issued Jun. 14, 2010.

International Search Report issued in corresponding application No. PCT/JP2007/056474, completed Apr. 26, 2007 and mailed May 15, 2007.

* cited by examiner

ENTIRE BEAM CONTAINING
OTHER TYPES OF IONS
EXCEPT DESIRED TYPE ION

BEAM CONTAINING
ONLY DESIRED TYPE ION

ION BEAM EXTRACTED FROM ION SOURCE

US 7,964,856 B2

ION IMPLANTING APPARATUS

This is a National Phase Application in the U.S. of International Patent Application No. PCT/JP2007/056474 filed Mar. 27, 2007, which claims priority on Japanese Patent Application No. 099477/2006, filed Mar. 31, 2006. The entire disclosures of the above patent applications are hereby incorporated by reference.

TECHNICAL FIELD

The present invention relates to an ion implanting apparatus which performs a mass-separation by allowing an ion beam containing a desired type of ion extracted from an ion source to pass through a magnetic field and which performs an ion implantation by irradiating the ion beam having been subjected to the mass-separation to a substrate.

BACKGROUND ART

In order to perform an ion implantation that impurities are implanted into silicon or a silicon thin film during a process in which a thin film transistor (TFT) is formed on a semiconductor substrate or a liquid-crystal glass substrate, an ion implanting apparatus is used. Exemplary types of ions implanted into the substrate include phosphorus (P), boron (B), and the like. In general, the ion implantation is performed in such a manner that raw material gas containing such exemplary types of ions is supplied to an ion source to be thereby plasmatized and a ribbon-shaped ion beam having a rectangular section, which is accelerated after being extracted from the plasma, is irradiated to the substrate.

Since the raw material gas is used by mixing hydrogen with phosphine ($PH_3$), diborane ($B_2H_6$) or the like, when the ion beam extracted from the ion source is directly irradiated to the substrate, unnecessary ions such as hydrogen ions are implanted into the substrate as well as P ions (PHx) or B ions ($B_2HX$) necessary to be implanted. In order to remove such unnecessary ions, Patent Documents 1 and 2 disclose a mass-separation ion implanting apparatus in which the ion beam extracted from the ion source is mass-separated to select a desired type of ion and the selected ion is irradiated to the substrate.

Such a mass-separation ion implanting apparatus includes a mass-separation electromagnet through which the ion beam extracted from the ion source passes and a slit to which the ion beam having passed through the electromagnet is irradiated. For instance, as shown in FIG. 1A, the slit disclosed in Patent Document 1 is configured such that a hole 63 is formed through a slit plate 62. As shown in FIG. 1B, the slit disclosed in Patent Document 2 is configured such that a pair of slit plates 64, 64 are opposed to each other on both sides in a thickness direction of the ion beam (a short dimension of a beam section) so that a gap therebetween is adjustable.

When the ion travels in a uniform magnetic field, the ion rotates at a curvature radius in accordance with electric charge and mass thereof. Accordingly, the mass-separation in accordance with types of ions can be performed in such a manner that the slit is disposed on a path where a desired type of ion among the ion beam having passed through the mass-separation electromagnet arrives.

[Patent Document 1] JP-A-H11-339711
[Patent Document 2] JP-A-2005-327713

In many cases, the mass-separation ion implanting apparatus has been used for not a liquid-crystal panel production, but a semiconductor production. Since a height of the ion implanting apparatus for the semiconductor production is 300 mm or so at maximum, a size of the ion beam may be identical with that of the semiconductor if the ion implantation is performed in a bundle without scanning the substrate. However, as a glass substrate for the liquid-crystal panel production to be subjected to an ion implantation, currently, there is known a glass substrate having a size 730 mm×920 mm. In the glass substrate having such a size, assuming that a scanning operation is performed along a long dimension of the substrate, a dimension in a width direction of the ion beam (a long dimension of the beam section) needs to be 800 mm or so. Since magnetic poles of the mass-separation electromagnet for performing the mass-separation are disposed on both sides in a width direction of the ion beam so as to be opposed to each other, a gap between the magnetic poles of the mass-separation electromagnet needs to be 800 mm or more in order to perform the mass-separation of the ion beam having a width of 800 mm or so.

Considering that the gap between the magnetic poles of the electromagnet having been used for the semiconductor production or an accelerator so far is several hundreds of mm or so at maximum, the gap between the magnetic poles of the mass-separation electromagnet for the liquid-crystal panel to be subjected to the ion implantation is very large. When a magnetic field is formed within such a large gap between the magnetic poles, it is very difficult to form a uniform magnetic field throughout the entire area where the ion beam passes. For this reason, when the ion beam passes through the electromagnet having a large gap between the magnetic poles thereof, a problem arises in that a strength or a direction of the magnetic field applied to the ions within the gap between the magnetic poles becomes different in accordance with a position where the ion beam passes due to the non-uniformity of the magnetic field.

When the ion beam having a rectangular section passes through an area where the magnetic field is non-uniform, the output ion beam becomes non-uniform in current density distribution or a shape of the ion beam section tends to vary from the rectangular shape to a crooked shape. For instance, since the magnetic field formed between the magnetic poles is strongly inclined at a position close to the magnetic poles, as shown in FIG. 2, the shape of the beam section tends to be crooked from the rectangular shape to a ⊂-shape. The reason is because a Lorenz force applied to the ion having passed through a strong part of the magnetic field becomes stronger than that of the ion having passed through a weak part of the magnetic field. In addition, the crooked shape of the ion beam is various in accordance with a type, a specification or a magnetic field generating method of the electromagnet to be used, but may be deformed into an inverse ⊂-shape or other shapes as well as the ⊂-shape.

Since the shape of the ion beam becomes crooked in this way, when the ⊂-shaped ion beam passes through the slit in which the hole is formed through the slit plate as shown in FIG. 1A, a problem arises in that a part of the ion beam leaking from the slit is shielded not to pass therethrough and thus current loss occurs.

When a slit gap becomes large in order to reduce the current loss by using the pair of the slit plates of which the gap is adjustable as shown in FIG. 1B (i.e., in order to increase current amount of the ion beam), a problem arises in that mass-separation resolution of the ion deteriorates.

In addition, as a technique for forming uniform magnetic field to remove drawbacks such as non-uniformity of the current density distribution and the crooked shape of the ion beam, a shape of the magnetic poles may be optimized by configuring the magnetic poles of the electromagnet as movable multi-polar magnetic poles. However, since the magnetic pole is generally made from pure steel or low carbon steel and weighs from several hundreds of kg to 1 ton, a problem arises in that manufacture cost increases upon applying an adjustment mechanism to such magnetic poles.

DISCLOSURE OF THE INVENTION

The present invention solves the above-described problems, and an object of the invention is to provide an ion implanting apparatus capable of reducing current loss while ensuring high mass-separation resolution upon mass-separating an ion. In addition, an object of the invention is to provide an ion implanting apparatus capable of realizing uniformity of current density distribution of an ion beam by reducing non-uniformity of the current density distribution thereof.

In order to attain the above-described object, the ion implanting apparatus related to the invention adopts the following configuration.

Aspect 1 of the invention provides an ion implanting apparatus which performs an ion implantation by irradiating an ion beam having passed through a separation slit to a substrate, the ion implanting apparatus including: an ion source which generates plasma containing a desired type of ion to be implanted into the substrate; an extraction electrode system which extracts an ion beam having a rectangular section and containing the desired type of ion from the plasma generated from the ion source; a mass-separation electromagnet which performs a mass-separation by bending the extracted ion beam in a thickness direction so as to derive the ion beam containing the desired type of ion; and the separation slit which receives the ion beam having passed through the mass-separation electromagnet and allows the desired type of ion to selectively pass therethrough, the separation slit being operable to vary a shape of a gap through which the ion beam passes.

According to the ion implanting apparatus described in Aspect 1, since the separation slit is operable to vary the shape of the gap through which the ion beam passes, it is possible to vary the shape of the gap in accordance with a crooked shape of the ion beam having passed through the mass-separation electromagnet. For instance, it is possible to deform the gap into a ⊂-shape so as to correspond to the ⊂-shape described above. Accordingly, it is possible to reduce the current loss while ensuring the high mass-separation resolution.

Aspect 2 of the invention provides an ion implanting apparatus which performs an ion implantation by irradiating an ion beam having passed through a separation slit to a substrate, the ion implanting apparatus including: an ion source which generates plasma containing a desired type of ion to be implanted into the substrate; an extraction electrode system which extracts an ion beam having a rectangular section and containing the desired type of ion from the plasma generated from the ion source; a mass-separation electromagnet which performs a mass-separation by bending the extracted ion beam in a thickness direction so as to derive the ion beam containing the desired type of ion; the separation slit which receives the ion beam having passed through the mass-separation electromagnet and allows the desired type of ion to selectively pass therethrough; and a variable slit which is disposed between the extraction electrode system and the mass-separation electromagnet so as to form a gap through which the ion beam passes and is operable to vary a shape of the gap so as to shield a part of the ion beam extracted from the ion source.

According to the ion implanting apparatus described in Aspect 2, since the variable slit is operable to vary a shape of the gap so as to shield a part of the ion beam extracted from the ion source, a predicted part of the ion beam of which current density becomes relatively high after passing the mass-separation electromagnet can be shielded in advance to be thereby removed. Accordingly, it is possible to realize uniformity of the current density distribution by removing non-uniformity the current density distribution of the ion beam having passed through the mass-separation electromagnet.

Aspect 3 of the invention provides an ion implanting apparatus which performs an ion implantation by irradiating an ion beam having passed through a separation slit to a substrate, the ion implanting apparatus including: an ion source which generates plasma containing a desired type of ion to be implanted into the substrate; an extraction electrode system which extracts an ion beam having a rectangular section and containing the desired type of ion from the plasma generated from the ion source; a mass-separation electromagnet which performs a mass-separation by bending the extracted ion beam in a thickness direction so as to derive the ion beam containing the desired type of ion; the separation slit which receives the ion beam having passed through the mass-separation electromagnet and allows the desired type of ion to selectively pass therethrough, the separation slit being operable to vary a shape of a gap through which the ion beam passes; and a variable slit which is disposed between the extraction electrode system and the mass-separation electromagnet so as to form a gap through which the ion beam passes and is operable to vary a shape of the gap so as to shield a part of the ion beam extracted from the ion source.

According to the ion implanting apparatus described in Aspect 3, since the separation slit is operable to vary a shape of the gap through which the ion beam passes, it is possible to vary the shape of the gap in accordance with a crooked shape of the ion beam having passed through the mass-separation electromagnet. Accordingly, it is possible to reduce the current loss while ensuring the high mass-separation resolution.

In addition, since the variable slit is operable to vary a shape of the gap so as to shield a part of the ion beam extracted from the ion source, a predicted part of the ion beam of which the current density becomes relatively high after passing the mass-separation electromagnet can be shielded in advance to be thereby removed. Accordingly, it is possible to realize uniformity of the current density distribution by removing non-uniformity the current density distribution of the ion beam having passed through the mass-separation electromagnet.

Aspect 4 of the invention provides the ion implanting apparatus according to Aspect 1 or 3, wherein the separation slit includes a first slit and a second slit which are disposed on both sides in a thickness direction of the ion beam so as to be opposed to each other with an interval therebetween, wherein the first slit and the second slit respectively include a plurality of small slits which are separated in a width direction of the ion beam, wherein the small slits are arranged so that a gap through which the ion beam passes is not formed between the small slits which are adjacent to each other in a width direction, and wherein the small slits are operable to move independently in a thickness direction.

According to the ion implanting apparatus described in Aspect 4, the first and second slits are opposed to each other on both sides in a thickness direction of the ion beam with an interval therebetween and respectively include the plurality of small slits separated in a width direction of the ion beam. Also, the small slits are independently movable in a thickness direction of the ion beam.

Accordingly, it is possible to easily vary a shape of the gap so as to correspond to the crooked shape of the ion beam having passed through the mass-separation electromagnet by adjusting the positions of the small slits. Additionally, since it is possible to better imitate the crooked shape of the ion beam as the number of the separated small slits increases, it is possible to further reduce the current loss and to improve the mass-separation resolution of the ion.

Aspect 5 of the invention provides ion implanting apparatus according to Aspect 4, further including: a beam profile monitor which is disposed on the downstream side of the mass-separation electromagnet in an ion beam travel direction so as to measure a shape of the section of the ion beam upon receiving the ion beam; an ion monitor which is disposed on the downstream side of the separation slit in an ion beam travel direction so as to measure types and ratios of ions contained in the ion beam upon receiving the ion beam having passed through the separation slit; and a control unit which is operable to independently control respective movements of the plurality of small slits and controls the respective small slits so as to obtain desired mass-separation resolution on the basis of measurement information obtained by the beam profile monitor and the ion monitor.

According to the ion implanting apparatus described in Aspect 5, since a desired mass-separation resolution is obtained by a feedback control of the small slits of the separation slit using the beam profile monitor, the ion monitor, and the control unit, it is possible to reduce the current loss while ensuring the high mass-separation resolution in terms of an automatic control.

Aspect 6 of the invention provides the ion implanting apparatus according to Aspect 2 or 3, wherein the variable slit includes a first slit and a second slit which are disposed on both sides in a thickness direction of the ion beam so as to be opposed to each other with an interval therebetween, wherein the first slit and the second slit respectively include a plurality of small slits which are separated in a width direction of the ion beam, and wherein the small slits are operable to move independently in a thickness direction.

According to the ion implanting apparatus described in Aspect 6, the first and second slits are opposed to each other on both sides in a thickness direction of the ion beam with an interval therebetween and respectively include the plurality of small slits separated in a width direction of the ion beam. Also, the small slits are independently movable in a thickness direction of the ion beam. Accordingly, it is possible to easily vary a shape of the gap so as to shield a part of the ion beam extracted from the ion source by adjusting the positions of the small slits.

Additionally, since it is possible to more minutely vary the shape of the gap as the number of the separated small slits increases, it is possible to more reduce non-uniformity of the current density distribution in the ion beam having passed through the mass-separation electromagnet and thus to more realize uniformity thereof.

Aspect 7 of the invention provides the ion implanting apparatus according to Aspect 6, further including: a beam profile monitor which is disposed on the downstream side of the mass-separation electromagnet in an ion beam travel direction so as to measure a shape of the section of the ion beam upon receiving the ion beam; and a control unit which is operable to independently control respective movements of the plurality of small slits, predicts a part of the ion beam of which the current density becomes relatively high after passing the mass-separation electromagnet among the ion beam received by the variable slit on the basis of measurement information obtained by the beam profile monitor, and controls the respective small slits so as to shield the part of the ion beam by using the respective small slits disposed at a position corresponding to the predicted part.

According to the ion implanting apparatus described in Aspect 7, a feedback control of the respective small slits of the variable slit is performed by the beam profile monitor and the control unit so that a part of the ion beam of which the current density becomes relatively high after passing the mass-separation electromagnet is predicted and the respective small slits is controlled to shield a part of the ion beam by using the small slits which are disposed at a position corresponding to the predicted part. Accordingly, it is possible to realize uniformity of the current density distribution of the ion beam having passed through the mass-separation electromagnet in terms of an automatic control.

As described above, according to the invention, it is possible to provide the ion implanting apparatus capable of reducing the current loss while ensuring the high mass-separation resolution upon mass-separating the ion. In addition, it is possible to provide the ion implanting apparatus capable of realizing the uniformity of the current density distribution of the ion beam by reducing the non-uniformity of the current density distribution thereof.

BEST MODE FOR CARRYING OUT THE INVENTION

Figure 1A:
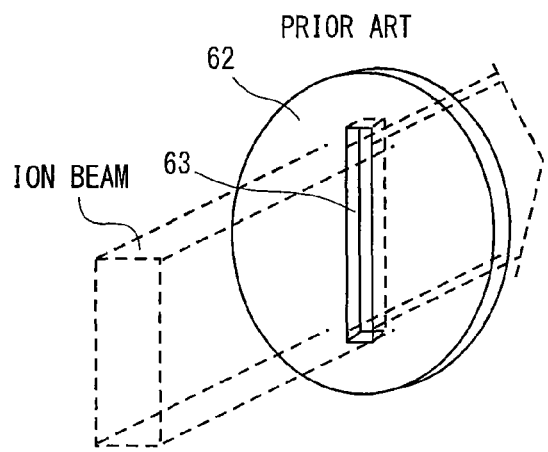
FIG. 1A is a diagram illustrating a configuration of a separation slit related to a known example.

Hereinafter, preferred embodiment of the invention will be described in detail with reference to the accompanying drawings. In addition, in the respective drawings, the same reference numerals are given to the same components and the repetitive description thereof will be omitted.

Figure 3:
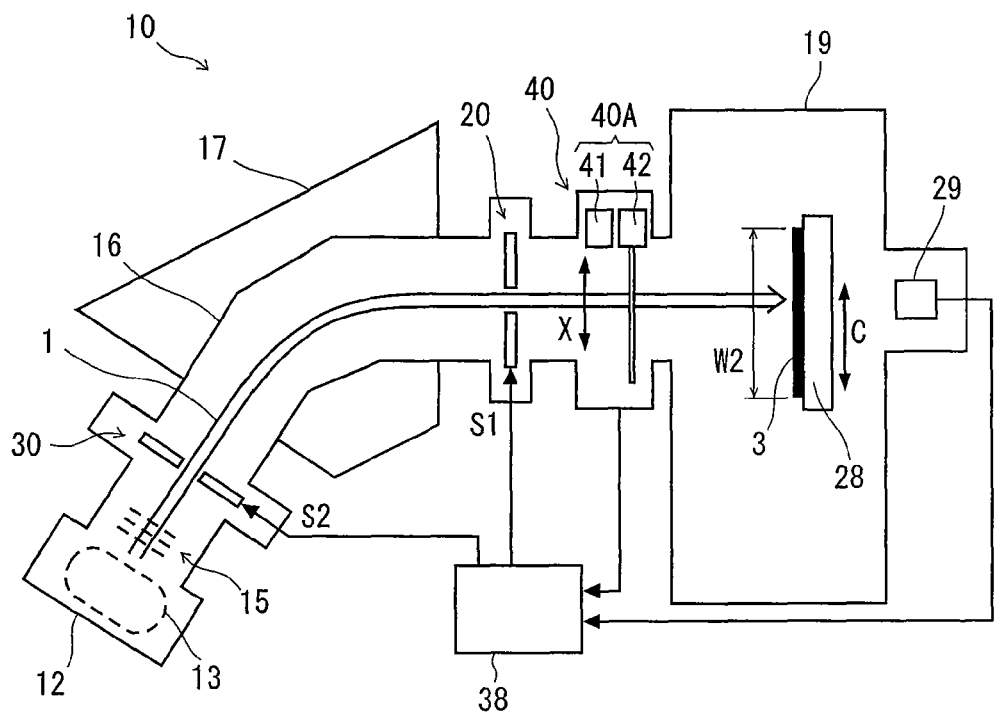
FIG. 3 is a top diagram illustrating a configuration of an ion implanting apparatus related to an embodiment of the invention.
Figure 4:
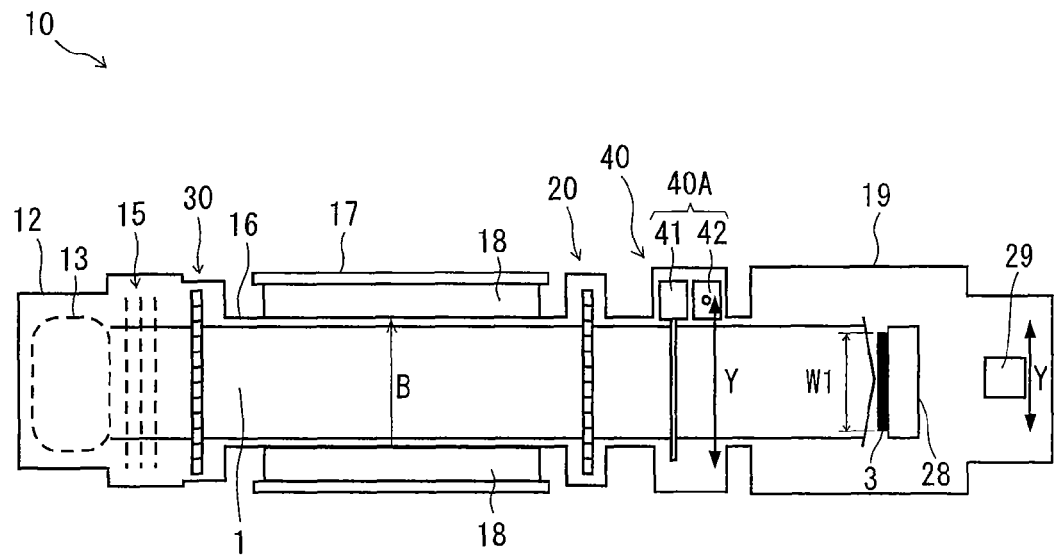
FIG. 4 is a side diagram illustrating the configuration of the ion implanting apparatus related to the embodiment of the invention.

FIGS. 3 and 4 are diagrams illustrating a configuration of an ion implanting apparatus 10 related to an embodiment of the invention, where FIG. 3 is a top diagram and FIG. 4 is a side diagram.

In the ion implanting apparatus 10, a substrate 3 to be processed is a semiconductor substrate 3, a liquid crystal panel glass substrate or the like. In this embodiment, the substrate 3 is formed into a rectangular shape such that a short-side dimension W1 is 730 mm and a long-side dimension W2 is 920 mm. However, the shape of the substrate is not limited to the rectangular shape, but may be a square shape or a circle shape.

The ion implanting apparatus 10 performs the ion implanting operation in such a manner that an ion beam 1 which contains a desired type of ion extracted from an ion source 12 is mass-separated by a mass separating electromagnet 17 and a desired type of ion selectively passes through a separation slit 20 to thereby arrive at a process chamber 19, thereby irradiating the ion beam 1 to the substrate 3 in the process chamber 19. That is, the ion implanting apparatus 10 is a mass-separation ion implanting apparatus.

A path of the ion beam 1 between the ion source 12 and the process chamber 19 is surrounded by a vacuum container 16. The ion source 12 is air-tightly connected to the vacuum container 16, the vacuum container 16 is air-tightly connected to the process chamber 19, and the inside thereof is maintained in a vacuum state by a vacuum pump (not shown).

The ion source 12 is a unit for generating plasma 13 containing a desired type of ion to be implanted into the substrate 3. An example of an ion to be implanted into the substrate 3 includes a P ion or a B ion. Material gas used for such ion is supplied from a supply unit (not shown) to the ion source 12. For instance, the material gas is phosphine ($PH_3$) in case of the P ion or is diborane ($B_2H_6$) in case of the B ion, which is mixed with hydrogen in use.

The ion source 12 ionizes a molecule of the supplied material gas by generating thermal electro using a filament (not shown) so as to generate plasma 13 containing a desired type of ion.

Figure 6:
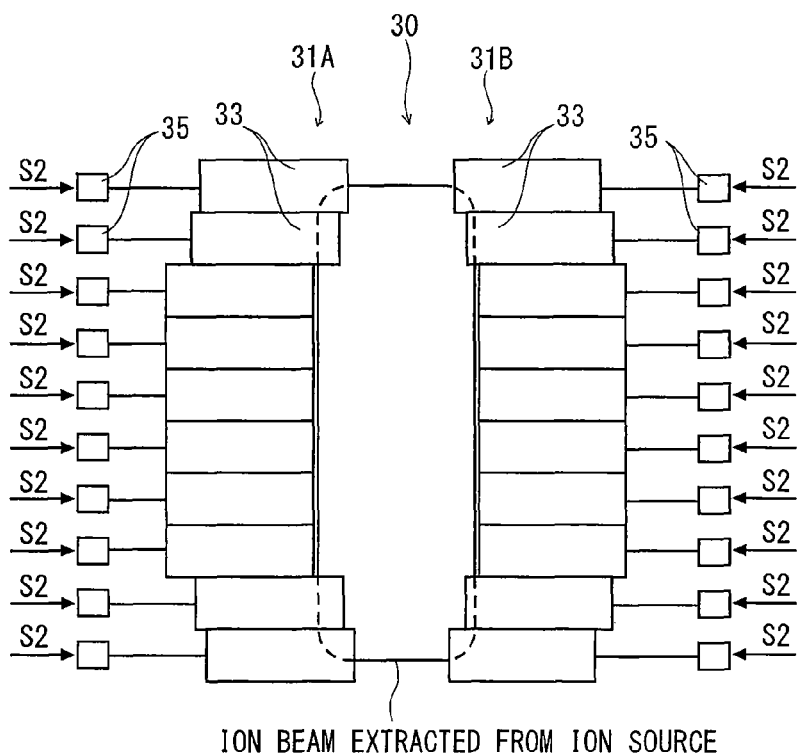
FIG. 6 is a diagram illustrating a configuration of a variable slit of the ion implanting apparatus related to the embodiment of the invention.

The plasma 13 containing a desired type of ion generated from the ion source 12 is extracted as the ribbon-shaped ion beam 1 having a rectangular section by an extraction electrode system 15 disposed on the outlet of the ion source 12 (see FIG. 6). The output electrode system 15 is provided with a plurality of electrodes having a plurality of holes (three electrodes in this example). However, the output electrode system 15 may be configured as a latticed, meshed or slit-shaped electrode.

A long dimension of a section perpendicular to an ion beam travel direction is larger than the short-side dimension W1 of the substrate 3. In case of the short-side dimension of 730 mm, the long dimension is not less than 800 mm (or so).

Hereinafter, in this specification, a section perpendicular to the ion beam travel direction is referred to as 'ion beam section' or simply 'beam section'. The long dimension of the beam section is referred to as 'ion beam width'. A short dimension of the beam section is referred to as 'ion beam thickness'.

In addition, in this specification, the rectangular section indicates an approximately rectangular section or a rectangular section as well as a perfect rectangular section.

The ion beam 1 extracted from the ion source 12 passes through a variable slit 30 to be thereby introduced into a mass-separation electromagnet 17. The mass-separation electromagnet 17 has magnetic poles 18 which are disposed on both sides in a width direction of the ion beam 1 passing therethrough so as to be opposed to each other, and forms a magnetic field perpendicular to the ion beam travel direction by using the magnetic poles 18. In this embodiment, the mass-separation electromagnet 17 forms a magnetic field in a direction indicated by the arrow B shown in FIG. 4. When the width of the ion beam 1 is 800 mm or so as described above, a gap between the magnetic poles 18 is not more than 800 mm.

As shown in FIG. 3, the mass-separation electromagnetic 17 with such a configuration performs a mass-separation by bending the ion beam 1 extracted from the ion source 12 in a thickness direction so as to output the ion beam 1 containing a desired type of ion.

When the ion beam 1 passes a magnetic field of the mass-separation electromagnet 17, the respective types of ions contained in the ion beam 1 rotate at curvature radiuses in accordance with electric charges and mass. Accordingly, the separation slit 20 is disposed on a path where a desired type of ion arrives after passing the magnetic field so as to allow the ion beam 1 output from the mass-separation electromagnet 17 to selectively pass therethrough. In addition, the separation slit 20 can vary a shape of a gap through which the ion beam 1 passes.

When a gap between magnetic poles of the mass-separation electromagnet 17 is larger than 800 mm, as described above, it is difficult to form a uniform magnetic field throughout the entire area where the ion beam passes. Then, when the ion beam 1 having a rectangular section passes through the electromagnets forming such a non-uniform magnetic field, as described above, the beam section shape deforms from a rectangular shape to a crooked shape (for instance, a ⊂-shape).

In this invention, since the separation slit 20 can vary a shape of a gap through which the ion beam 1 passes, it is possible to vary a shape of the gap so as to correspond to the crooked shape of the ion beam 1 having passed through the mass-separation electromagnet 17. For instance, it is possible to deform the gap into a ⊂-shape so as to correspond to the ⊂-shape described above. Accordingly, it is possible to reduce current loss while ensuring high mass-separation resolution.

In addition, the crooked shape of the ion beam 1 is various in accordance with a type, a specification or a magnetic field generating method of the electromagnet to be used, but may be deformed into an inverse ⊂-shape or other shapes as well as the ⊂-shape.

Figure 5:
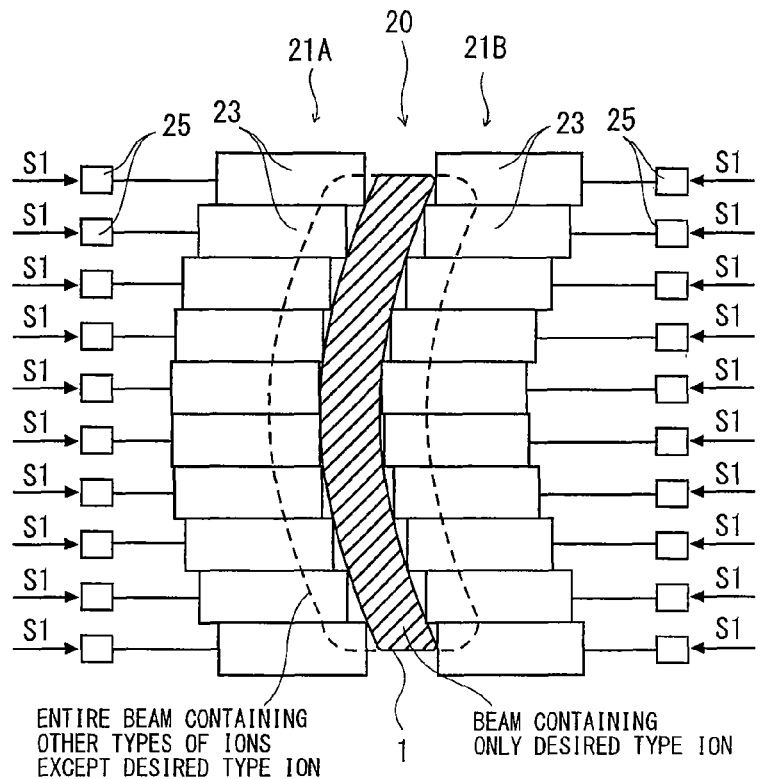
FIG. 5 is a diagram illustrating a configuration of the separation slit of the ion implanting apparatus related to the embodiment of the invention.

The separation slit 20 related to this embodiment will be described in more detail. FIG. 5 is a diagram illustrating a configuration of the sedation slit 20 related to this embodiment. This diagram illustrates an exemplary case that the ion beam 1 is deformed into a ⊂-shape after passing through the mass-separation electromagnet 17.

As shown in FIG. 5, the separation slit 20 includes a first slit 21A and a second slit 21B which are disposed on both sides in a thickness direction of the ion beam 1 so as to be opposed to each other with an interval therebetween. The ion beam 1 passes a gap formed by the first slit 21A and the second slit 21B. The first slit 21A and the second slit 21B include a plurality of small slits 23, 23 . . . which are separated in a width direction of the ion beam 1.

In this embodiment, each of the small slits 23 is formed into an elongate rectangular shape. In addition, the first slit 21A and the second slit 21B are respectively separated into ten members. A pair of members is opposed to each other in a thickness direction of the ion beam 1, and ten pairs of members are arranged in this way.

The small slits 23 are arranged so that a gap through which the ion beam 1 passes is not formed between the small slits 23 which are adjacent to each other in a width direction of the ion beam 1. The configuration that the small slits 23 are arranged so that the gap through which the ion beam 1 passes is not formed between the small slits 23 is not particularly limited. For instance, the small slits 23 may be arranged while being deviated from each other so that the small slits 23, which are adjacent to each other in a width direction of the ion beam 1, partly overlap with each other when viewed in a beam travel direction. Alternatively, opposed side portions of the small slits 23 which are adjacent to each other in a width direction of the ion beam 1 may be respectively formed into a convex shape and a concave shape in a section so that one small slit 23 and the other slit 23 are inserted to each other and relatively move in a width direction of the ion beam 1.

In addition, the respective small slits 23 are configured to independently move in a thickness direction of the ion beam 1. In this embodiment, the respective small slits 23 can reciprocate in a thickness direction of the ion beam 1 by actuators 25, 25 . . . . The respective actuators 25 are controlled on the basis of a control signal S1 output from a control unit 38 described below.

With such a configuration, it is possible to easily vary a shape of the gap so as to correspond to the crooked shape of the ion beam 1 having passed through the mass-separation electromagnet 17 by adjusting the positions of the small slits 23.

Accordingly, as shown in FIG. 5, since the positions of the small slits 23 are adjusted so as to correspond to an external shape of the ion beam containing a desired type of ion, the other types of ions except the desired type of ion are shielded. In this way, since the desired type of ion can selectively pass therethrough, it is possible to reduce the current loss while ensuring the high mass-separation resolution.

Additionally, since it is possible to better imitate the crooked shape of the ion beam as the number of the separated small slits 23 increases, it is possible to further reduce the current loss and to improve the mass-separation resolution of the ion.

In addition, in FIG. 5, the positions of the small slits 23 are adjusted so as to correspond to the external shape of the ion beam containing the desired type of ion. However, when obtaining the higher mass-separation resolution, the positions of the small slits 23 may be adjusted so as to completely shield the other types of ions except the desired type of ion. In this case, the much higher mass-separation resolution is obtained, but a current loss reduction advantage of the example shown in FIG. 5 is slightly better than that in this case. However, even in this case, it is obvious that the current loss is still less than that of the known example.

In addition, priority of the mass-separation resolution improvement or the current loss reduction is individually determined on the basis of a target product or a user, and the priority varies case by case. Then, it is possible to obtain excellent advantage that the current loss is reduced while ensuring the high mass-separation resolution all the time irrespective of the priority of the mass-separation resolution improvement or the current loss reduction.

The process chamber 19 has therein a substrate slider 28 which moves the substrate 3 in a direction indicated by the arrow C while holding the substrate 3. The substrate slider 28 is driven by a drive unit (not shown) so as to reciprocate. In this embodiment, a direction of the arrow C is identical with a thickness direction of the ion beam 1 having passed through the separation slit 20. Then, the ion beam 1 having a width wider than the short-side dimension W1 of the substrate 3 is irradiated to the substrate 3 while moving the substrate 3, and thus the ion beam 1 is irradiated to the entire surface of the substrate 3. In this way, it is possible to perform the ion implanting operation.

As shown in FIGS. 3 and 4, the ion implanting apparatus 10 related to this embodiment further includes a beam profile monitor 40, an ion monitor 29, and a control unit 38.

The beam profile monitor 40 is disposed on the downstream side of the mass-separation electromagnet 17 in a direction where the ion beam 1 travels and measures the section shape of the ion beam 1 upon receiving the ion beam 1. In this embodiment, the beam profile monitor 40 is a movable wire collector 40A and includes a first wire 41 which can reciprocate in a direction indicated by the arrow X (in a thickness direction of the ion beam 1) and a second wire 42 which can reciprocate in a direction indicated by the arrow Y. The movable wire collector 40A moves the first wire 41 and the second wire 42 in X and Y directions, respectively, while receiving the ion beam 1 so as to obtain current values of the ion beam 1 in X and Y directions and to measure the section shape of the ion beam 1 on the basis of the current values. When measuring the section shape of the ion beam 1, it is necessary to fully open a slit width of the separation slit 20.

The beam profile monitor 40 can measure (estimate) current density distribution of the ion beam 1.

Then, the beam profile monitor 40 is not limited to the movable wire collector 40A, but may be configured as other general members. In this embodiment, although the beam profile monitor 40 is disposed between the separation slit 20 and the process chamber 19, the beam profile monitor 40 may be disposed on the front-surface side or the rear-surface side of the substrate slider 28 in the process chamber 19 or may be disposed between the mass-separation electromagnet 17 and the separation slit 20 within a range capable of capturing the ion beam 1.

An ion monitor 29 is disposed on the downstream side of the separation slit 20 in a direction where the ion beam 1 travels and measures the types and the ratios of ions contained in the ion beam 1 upon receiving the ion beam 1 having passed through the separation slit 20. The type of the ion monitor 29 is not particularly limited, but may be, for instance, a mass analysis type using an electromagnet and one or more faraday cups or other general types.

Although the ion monitor 29 related to this embodiment does not move in an X direction (in a thickness direction of the ion beam 1), the ion monitor 29 can sufficiently cope with a thickness of the ion beam 1. In addition, the ion monitor 29 is driven by a drive unit (not shown) so as to reciprocate in a Y direction (in a width direction of the ion beam 1).

With such a configuration, it is possible to measure the type and the ratio of the ions within a predetermined range at an arbitrary position of the width direction of the ion beam 1. The ion monitor 29 can measure the types and the ratios of the ions contained in the ion beam within a range corresponding to one or more pairs of the small slits 23.

In this embodiment, the ion monitor 29 is disposed on the rear-surface side of the substrate slider 28, but may be disposed on the front-surface side of the substrate slider 28 so long as the ion monitor 29 is disposed on the downstream side of the separation slit 20 in an ion beam travel direction.

The control unit 38 can independently control the respective movements of the plurality of small slits 23 in the separation slit 20, and controls the small slits 23 on the basis of measurement information obtained by the beam profile monitor 40 and the ion monitor 29 so as to obtain desired mass-separation resolution.

The control will be described in detail with reference to FIG. 5. First, the positions of the small slits 23 are adjusted so as to maximize a slit width between the first slit 21A and the second slit 21B. In this state, a section shape of the ion beam 1 having passed through the mass-separation electromagnet 17 (the shape of the entire ion beam containing the other types of ions as well as the desired type of ion in FIG. 5) is measured (estimated) by the beam profile monitor 40. On the basis of the measurement information, the respective small slits 23 are moved to a predetermined position. For instance, the small slits 23 may move to a predetermined position so as to shield both sides in a thickness direction of the ion beam by a predetermined amount with respect to the shape of the entire ion beam containing the other types of ions as well as the desired type of ion. Alternatively, the small slits 23 may move to a predetermined position on the basis of data experimentally obtained in advance with respect to the shape of the ion beam containing the desired type of ion.

Next, the ion monitor 29 measures the types and the ratios of the ions contained in the ion beam 1 within a range corresponding to one pair or plural pairs of small slits 23. When the mass-separation resolution is obtained from the measurement information and the mass-separation resolution does not satisfy a desired value, the mass-separation resolution is again obtained from the measurement information of the ion monitor 29 by moving one or both of the pair of small slits 23 so as to narrow a slit width. This operation is repeated until the mass-separation resolution satisfies a desired value. On the other hand, when the mass-separation resolution satisfies a desired value, the ion monitor 29 moves within a range corresponding to the other pair of small slits 23, and then the above-described operation is performed in the same way. In this way, when the mass-separation resolution satisfies a desired value in a width direction of the ion beam 1 as a whole, a position adjustment control of the separation slit 20 using the control unit 38 ends.

As described above, since a desired mass-separation resolution is obtained by a feedback control of the small slits 23 of the separation slit 20 using the beam profile monitor 40, the ion monitor 29, and the control unit 38, it is possible to reduce the current loss while ensuring the high mass-separation resolution in terms of an automatic control.

The ion implanting apparatus 10 related to this embodiment further includes a variable slit 30 which is disposed between the extraction electrode system 15 and the mass-separation electromagnet 17. The variable slit 30 forms a gap through which the ion beam 1 passes, and can vary a shape of the gap so as to shield a part of the ion beam 1 extracted from the ion source 12.

As described above, when a gap between the magnetic poles of the separation electromagnet 17 becomes large so as to correspond to the substrate 3 with a large area, it is difficult to ensure a uniform magnetic field throughout the entire area where the ion beam passes. In this case, in the ion beam 1 having passed through the mass-separation electromagnet 17, non-uniformity of current density occurs in the beam section due to non-uniform magnetic field.

In this invention, since the variable slit 30 can vary the shape of the gap so as to shield a part of the ion beam 1 extracted from the ion beam 1, a part of the ion beam 1 can be shielded to be thereby removed in advance. At this time, a part of the ion beam 1 indicates a predicted part of the ion beam 1 of which current density becomes relatively high after the ion beam 1 passes through the mass-separation electromagnet 17. Accordingly, it is possible to realize uniformity of the ion beam 1 by reducing non-uniformity of the ion beam 1 having passed through the mass-separation electromagnet 17.

The variable slit 30 related to this embodiment will be described in more detail. FIG. 6 is a diagram illustrating a configuration of the variable slit 30 related to this embodiment.

As shown in FIG. 6, the variable slit 30 related to this embodiment has the same configuration as that of the separation slit 20 described above. That is, the variable slit 30 includes a first slit 31A and a second slit 31B which are disposed on both sides in a thickness direction of the ion beam 1 so as to be opposed to each other with an interval therebetween. The ion beam 1 passes a gap formed by the first slit 31A and the second slit 31B. The first slit 31A and the second slit 31B include a plurality of small slits 33, 33 . . . which are separated in a width direction of the ion beam 1.

In this embodiment, each of the small slits 33 is formed into an elongate rectangular shape. In addition, the first slit 31A and the second slit 31B are respectively separated into ten members. A pair of members is opposed to each other in a thickness direction of the ion beam 1, and ten pairs of members are arranged in this way.

The small slits 33 are arranged so that a gap through which the ion beam 1 passes is not formed between the small slits 33 which are adjacent to each other in a width direction of the ion beam 1. The configuration that the small slits 33 are arranged so that the gap through which the ion beam 1 passes is not formed between the small slits 33 can be realized in the same way as the separation slit 20 described above.

However, although the gap through which the ion beam 1 passes is not formed in the separation slit 20 so as to select a desired type of ion by shielding the other types of ions except a desired type of ion, it is not necessary to arrange the respective small slits 33 without forming a gap through which the ion beam 1 passes between the respective small slits 33 so long as the respective small slits 33 of the variable slit 30 can shield a part of the ion beam 1.

In addition, the respective small slits 33 are configured to independently move in a thickness direction of the ion beam 1. In this embodiment, the respective small slits 33 can reciprocate in a thickness direction of the ion beam 1 by actuators 35, 35 . . . . The respective actuators 35 are controlled on the basis of a control signal S2 output from the control unit 38.

With such a configuration, it is possible to easily vary a shape of the gap so as to shield a part of the ion beam 1 extracted from the ion source 12 by adjusting the positions of the small slits 33.

Accordingly, as shown in FIG. 6, it is possible to shield a part of the ion beam 1 to be thereby removed in advance. At this time, the part of the ion beam 1 indicates a predicted part of the ion beam 1 of which current density becomes relatively high after the ion beam 1 passes the mass-separation electromagnet 17. Specifically, for instance, when it is predicted that current density becomes relatively higher at a part around both sides in a width direction of the ion beam 1 close to the magnetic poles 18 than the center of the ion beam 1 having passed through the mass-separation electromagnet 17, as shown on FIG. 6, a part of the ion beam 1 is removed in advance by narrowing a slit width of the respective small slits 33 which are disposed at a position corresponding to both sides of the width direction of the ion beam 1. Accordingly, it is possible to restrict current density of the ion beam 1 from being relatively high at a part around both sides in a width direction of the ion beam 1 by removing a part of the ion beam 1 having passed through the mass-separation electromagnet 17. As a result, it is possible to alleviate current density difference between the part around both sides and the center of the ion beam 1 and thus to realize uniformity of the current density distribution throughout the entire ion beam 1.

Additionally, since it is possible to more minutely vary the shape of the gap as the number of the separated small slits 33 increases, it is possible to more reduce non-uniformity of the current density distribution in the ion beam 1 having passed through the mass-separation electromagnet 17 and thus to more realize uniformity thereof.

The variable slit 30 is controlled on the basis of the control signal S2 output from the control unit 38. The control unit 38 can independently control the respective movements of the plurality of small slits 33. The control unit 38 predicts a part of the ion beam 1 of which current density becomes relatively high after passing the mass-separation electromagnet 17 among the ion beam 1 received by the variable slit 30 on the basis of the measurement information obtained by the beam profile monitor 40 and controls the respective small slits 33 so as to shield a part of the ion beam 1 by using the respective small slits 33 disposed at a position corresponding to the predicted part. In this embodiment, the variable slit 30 and the separation slit 20 are controlled by the same control unit 38, but may be controlled by different control units 38, respectively.

The control will be described in detail with reference to FIG. 6. First, the positions of the small slits 33 are adjusted so as to maximize a slit width between the first slit 31A and the second slit 31B of the variable slit 30. In this state, a section shape and current density distribution of the ion beam 1 are measured (estimated) by the beam profile monitor 40. Since the beam profile monitor 40 is disposed on the downstream side of the mass-separation electromagnet 17 in an ion beam travel direction, it is possible to measure the section shape and the current density distribution of the ion beam 1 having passed through the mass-separation electromagnet 17. The control unit 38 predicts a part of the ion beam 1 of which current density becomes relatively high after passing the mass-separation electromagnet 17 among the ion beam 1 received by the variable slit 30 on the basis of the measurement information obtained by the beam profile monitor 40. The control unit 38 removes a part of the ion beam 1 in advance by narrowing a slit width of the small slits 33 which are disposed at a position corresponding to the predicted part on the basis of the predicted result. For instance, when it is predicted that current density becomes relatively higher at a part around both sides in a width direction of the ion beam 1 close to the magnetic poles 18 than the center of the ion beam 1 having passed through the mass-separation electromagnet 17, as shown in FIG. 6, a part of the ion beam 1 is removed in advance by narrowing a slit width of the respective small slits 33 which are disposed at a position corresponding to both sides of the width direction of the ion beam 1.

In this state, the current density distribution of the ion beam 1 having passed through the variable slit 30 and the mass-separation electromagnet 17 is again measured by the beam profile monitor 40. The control unit 38 determines whether the current density distribution is uniform. At a first measurement, when the predicted part of the ion beam 1 of which the current density becomes relatively high is still high, the respective slits 33 move in a direction where the slit width is further narrowed. On the contrary, when the predicted part of the ion beam 1 of which the current density becomes relative high is too low, the respective slits 33 move in a direction where the slit gap is widened. When the control unit 38 determines that the current density distribution is uniform after repeating such operations, the position adjustment control of the variable slit 30 ends.

In this way, a feedback control of the respective small slits 33 of the variable slit 30 is performed by the beam profile monitor 40 and the control unit 38 so that a part of the ion beam 1 of which the current density becomes relatively high after passing the mass-separation electromagnet 17 is predicted and the respective small slits 33 is controlled to shield a part of the ion beam 1 by using the small slits 33 which are disposed at a position corresponding to the predicted part. Accordingly, it is possible to realize uniformity of the current density distribution of the ion beam 1 having passed through the mass-separation electromagnet 17 in terms of an automatic control.

Figure 7:
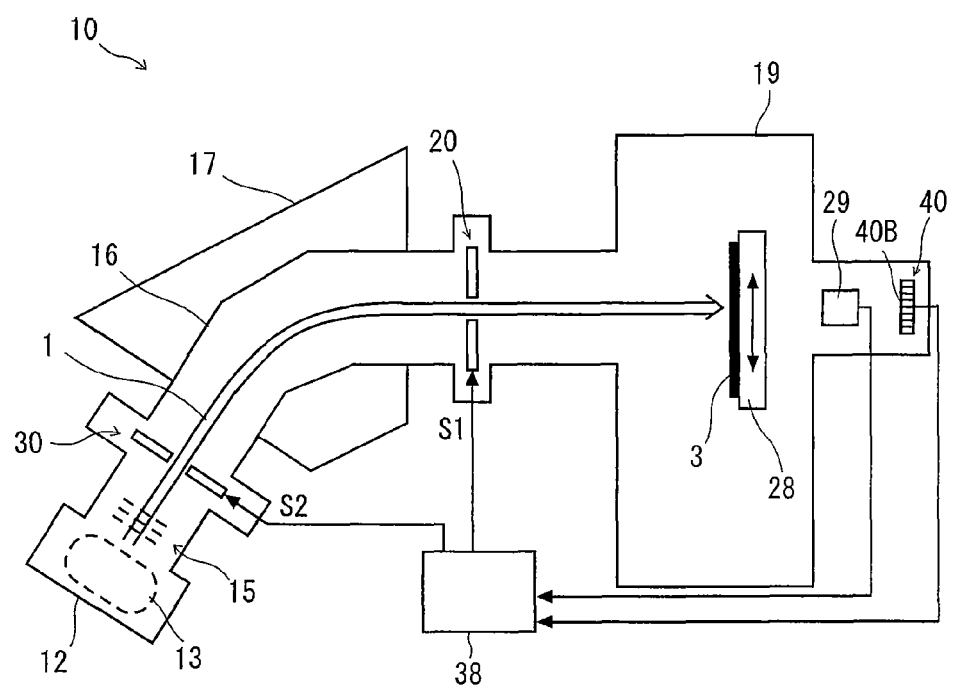
FIG. 7 is a top diagram illustrating the configuration of the ion implanting apparatus related to another embodiment of the invention.
Figure 8:
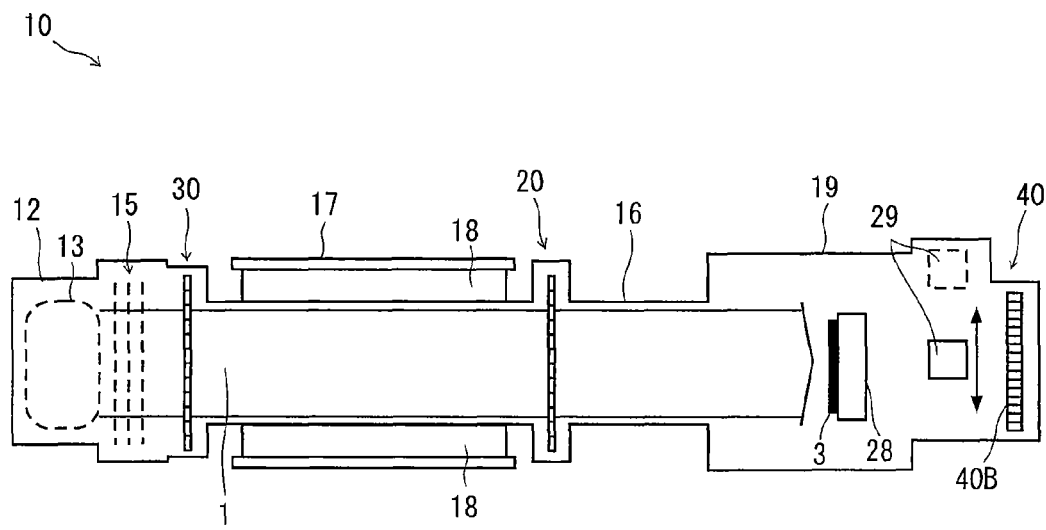
FIG. 8 is a side diagram illustrating the configuration of the ion implanting apparatus related to another embodiment of the invention.

In the above-described embodiment, the movable wire collector 40A is configured as the beam profile monitor 40, but instead may be configured as a faraday cup array 40B shown in FIGS. 7 and 8. The faraday cup array 40B is disposed on the rear-surface side of the ion monitor 29. The faraday cup array 40B is configured such that a plurality of faraday cups is arranged in a width direction and a thickness direction of the ion beam 1. The plurality of faraday cups are provided in parallel at an area larger than the section shape of the ion beam 1.

By using the faraday cup 40B with the above-described configuration, it is possible to measure the section shape and the current density distribution of the ion beam 1 upon receiving the ion beam 1. In addition, at the measurement performed by the faraday cup array 40B, the substrate slider 28 moves to a position not interrupting the ion beam 1 irradiated to the faraday cup array 40B.

As shown in FIG. 8, the ion monitor 29 can escape up to a position indicated by a dashed line so as not to interrupt the ion beam 1 irradiated to the faraday cup array 40B at the measurement performed by the faraday cup array 40B.

In the above-described embodiment, both the variable slit 30 and the separation slit 20 which can vary the shape of the gap are provided, but one of them may be provided instead.

That is, only the separation slit 20 which can vary the shape of the gap may be provided without the variable slit 30. In this case, although it is not possible to realize uniformity of the current density of the ion beam 1, it is possible to reduce the current loss while ensuring the high mass-separation resolution.

Figure 1B:
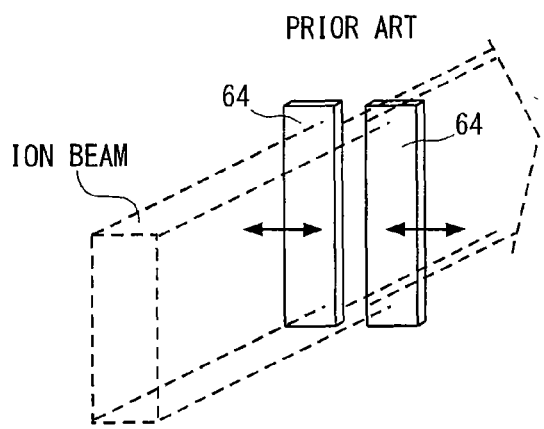
FIG. 1B is a diagram illustrating a configuration of another separation slit related to the known example.
Figure 2:
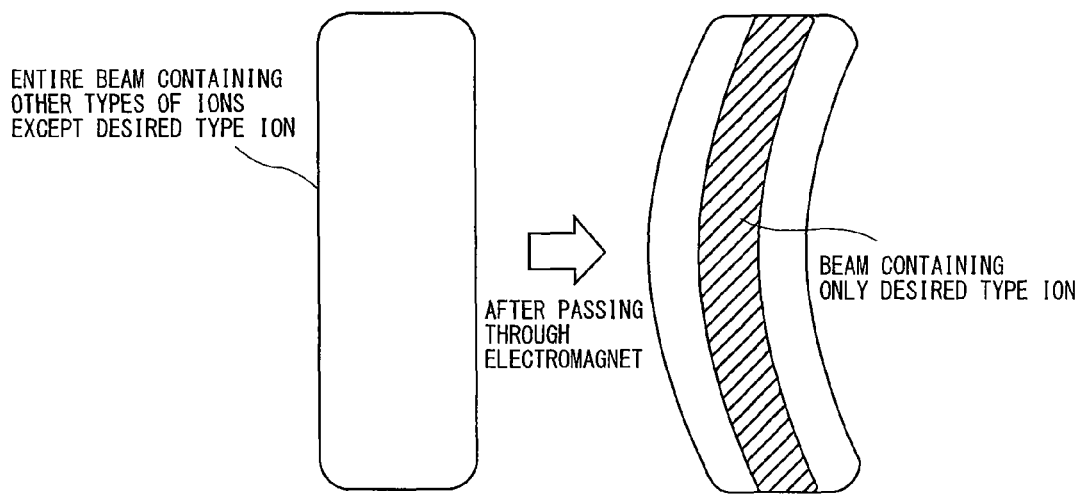
FIG. 2 is a diagram illustrating a modified sectional shape of an ion beam.

In addition, only the variable slit 30 may be provided without the separation slit 20 which can vary the shape of the gap. In this case, although it is not possible to reduce the current loss while ensuring the high-mass separation resolution, it is possible to realize uniformity of the current density of the ion beam 1. However, when the separation slit 20 which can vary the shape of the gap is not provided, it is necessary to provide, for instance, other separation slits shown in FIGS. 1A and 1B so as to select the desired type of ion.

While preferred embodiments of the invention as described and illustrated above, it should be understood that these are exemplary of the invention and are not to be considered as limiting. The scope of the invention is illustrated in the appended claims and various modifications can be made within the meaning and scope equivalent to the description in the appended claims.

The invention claimed is:

1. An ion implanting apparatus which performs an ion implantation by irradiating an ion beam having passed through a separation slit to a substrate, the ion implanting apparatus comprising:
   (a) an ion source that generates plasma containing a desired type of ion to be implanted into the substrate;
   (b) an extraction electrode system that extracts an ion beam having a rectangular section and containing the desired type of ion from the plasma generated from the ion source;
   (c) a mass-separation electromagnet that performs a mass-separation by bending the extracted ion beam in a thickness direction so as to derive the ion beam containing the desired type of ion; and
   (d) the separation slit that receives the ion beam having passed through the mass-separation electromagnet and that allows the desired type of ion to selectively pass therethrough, wherein the separation slit is operable to vary a shape of a gap through which the ion beam passes, wherein the separation slit includes a first slit and a second slit that are disposed on both sides in a thickness direction of the ion beam so as to be opposed to each other with an interval therebetween, wherein the first slit and the second slit respectively include a plurality of small slits that are separated in a width direction of the ion beam, wherein the small slits are arranged so that a gap through which the ion beam passes is not formed between the small slits that are adjacent to each other in a width direction, and wherein the small slits are operable to move independently in a thickness direction.

2. An ion implanting apparatus which performs an ion implantation by irradiating an ion beam having passed through a separation slit to a substrate, the ion implanting apparatus comprising:
   (a) an ion source that generates plasma containing a desired type of ion to be implanted into the substrate;
   (b) an extraction electrode system that extracts an ion beam having a rectangular section and containing the desired type of ion from the plasma generated from the ion source;
   (c) a mass-separation electromagnet that performs a mass-separation by bending the extracted ion beam in a thickness direction so as to derive the ion beam containing the desired type of ion;
   (d) the separation slit that receives the ion beam having passed through the mass-separation electromagnet and that allows the desired type of ion to selectively pass therethrough; and
   (e) a variable slit that is disposed between the extraction electrode system and the mass-separation electromagnet so as to form a gap through which the ion beam passes and that is operable to vary a shape of the gap so as to shield a part of the ion beam extracted from the ion source, wherein the variable slit includes a first slit and a second slit that are disposed on both sides in a thickness direction of the ion beam so as to be opposed to each other with an interval therebetween, wherein the first slit and the second slit respectively include a plurality of small slits that are separated in a width direction of the ion beam, and wherein the small slits are operable to move independently in a thickness direction.

3. An ion implanting apparatus which performs an ion implantation by irradiating an ion beam having passed through a separation slit to a substrate, the ion implanting apparatus comprising:
   (a) an ion source that generates plasma containing a desired type of ion to be implanted into the substrate;
   (b) an extraction electrode system that extracts an ion beam having a rectangular section and containing the desired type of ion from the plasma generated from the ion source;
   (c) a mass-separation electromagnet that performs a mass-separation by bending the extracted ion beam in a thickness direction so as to derive the ion beam containing the desired type of ion;
   (d) the separation slit that receives the ion beam having passed through the mass-separation electromagnet and allows the desired type of ion to selectively pass therethrough, wherein the separation slit is operable to vary a shape of a gap through which the ion beam passes; and
   (e) a variable slit that is disposed between the extraction electrode system and the mass-separation electromagnet so as to form a gap through which the ion beam passes and that is operable to vary a shape of the gap so as to shield a part of the ion beam extracted from the ion source, wherein the variable slit includes a first slit and a second slit that are disposed on both sides in a thickness direction of the ion beam so as to be opposed to each other with an interval therebetween, wherein the first slit and the second slit respectively include a plurality of small slits that are separated in a width direction of the ion beam, and wherein the small slits are operable to move independently in a thickness direction.

4. The ion implanting apparatus according to claim 1, further comprising:
   (e) a beam profile monitor that is disposed on a downstream side of the mass-separation electromagnet in an ion beam travel direction so as to measure a shape of the section of the ion beam upon receiving the ion beam;
   (f) an ion monitor that is disposed on a downstream side of the separation slit in an ion beam travel direction so as to measure types and ratios of ions contained in the ion beam upon receiving the ion beam having passed through the separation slit; and
   (g) a control unit that is operable to independently control respective movements of the plurality of small slits and controls the respective small slits so as to obtain desired mass-separation resolution on the basis of measurement information obtained by the beam profile monitor and the ion monitor.

5. The ion implanting apparatus according to claim 2, further comprising:
   (f) a beam profile monitor that is disposed on the downstream side of the mass-separation electromagnet in an ion beam travel direction so as to measure a shape of the section of the ion beam upon receiving the ion beam; and
   (g) a control unit that is operable to independently control respective movements of the plurality of small slits, and that predicts a part of the ion beam of which current density becomes relatively high after passing the mass-separation electromagnet among the ion beam received by the variable slit on the basis of measurement information obtained by the beam profile monitor, and controls the respective small slits so as to shield the part of the ion beam by using the respective small slits disposed at a position corresponding to the predicted part.

6. An ion implanting apparatus which performs an ion implantation by irradiating an ion beam having passed through a separation slit to a substrate, the ion implanting apparatus comprising:
   (a) an ion source that generates plasma containing a desired type of ion to be implanted into the substrate;
   (b) an extraction electrode system that extracts an ion beam having a rectangular section and containing the desired type of ion from the plasma generated from the ion source;
   (c) a mass-separation electromagnet that performs a mass-separation by bending the extracted ion beam in a thickness direction so as to derive the ion beam containing the desired type of ion;
   (d) the separation slit that receives the ion beam having passed through the mass-separation electromagnet and allows the desired type of ion to selectively pass therethrough, wherein the separation slit is operable to vary a shape of a gap through which the ion beam passes, wherein the separation slit includes a first slit and a second slit that are disposed on both sides in a thickness direction of the ion beam so as to be opposed to each other with an interval therebetween, wherein the first slit and the second slit respectively include a plurality of small slits that are separated in a width direction of the ion beam, wherein the small slits are arranged so that a gap through which the ion beam passes is not formed between the small slits that are adjacent to each other in a width direction, and wherein the small slits are operable to move independently in a thickness direction; and (e) a variable slit that is disposed between the extraction electrode system and the mass-separation electromagnet so as to form a gap through which the ion beam passes and that is operable to vary a shape of the gap so as to shield a part of the ion beam extracted from the ion source.

7. The ion implanting apparatus according to claim 6, further comprising:

(f) a beam profile monitor that is disposed on a downstream side of the mass-separation electromagnet in an ion beam travel direction so as to measure a shape of the section of the ion beam upon receiving the ion beam;

(g) an ion monitor that is disposed on a downstream side of the separation slit in an ion beam travel direction so as to measure types and ratios of ions contained in the ion beam upon receiving the ion beam having passed through the separation slit; and (h) a control unit that is operable to independently control respective movements of the plurality of small slits and controls the respective small slits so as to obtain desired mass-separation resolution on the basis of measurement information obtained by the beam profile monitor and the ion monitor.

8. The ion implanting apparatus according to claim 3, further comprising:

(f) a beam profile monitor that is disposed on the downstream side of the mass-separation electromagnet in an ion beam travel direction so as to measure a shape of the section of the ion beam upon receiving the ion beam; and (g) a control unit that is operable to independently control respective movements of the plurality of small slits, and that predicts a part of the ion beam of which current density becomes relatively high after passing the mass-separation electromagnet among the ion beam received by the variable slit on the basis of measurement information obtained by the beam profile monitor, and controls the respective small slits so as to shield the part of the ion beam by using the respective small slits disposed at a position corresponding to the predicted part.

* * * * *